United States Patent
Kawabata et al.

(10) Patent No.: US 8,120,944 B2
(45) Date of Patent: Feb. 21, 2012

(54) CONTROL CIRCUIT FOR FORMING PROCESS ON NONVOLATILE VARIABLE RESISTIVE ELEMENT AND CONTROL METHOD FOR FORMING PROCESS

(75) Inventors: Suguru Kawabata, Osaka (JP); Kazuya Ishihara, Osaka (JP); Yoshiji Ohta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 146 days.

(21) Appl. No.: 12/722,851

(22) Filed: Mar. 12, 2010

(65) Prior Publication Data

US 2010/0232209 A1  Sep. 16, 2010

(30) Foreign Application Priority Data

Mar. 13, 2009  (JP) ................................. 2009-061771

(51) Int. Cl.
*G11C 11/00* (2006.01)
(52) U.S. Cl. ........................................ 365/148; 365/163
(58) Field of Classification Search .................. 365/148, 365/163, 158
See application file for complete search history.

(56) References Cited

U.S. PATENT DOCUMENTS

| | | | |
|---|---|---|---|
| 6,204,139 B1 | 3/2001 | Liu et al. | |
| 6,815,744 B1 | 11/2004 | Beck et al. | |
| 7,606,086 B2 * | 10/2009 | Inoue | 365/189.15 |
| 2004/0114444 A1 | 6/2004 | Matsuoka | |
| 2007/0195581 A1 | 8/2007 | Morimoto | |
| 2009/0237992 A1 * | 9/2009 | Maejima | 365/185.03 |
| 2009/0251945 A1 * | 10/2009 | Shinozaki | 365/148 |

FOREIGN PATENT DOCUMENTS

| | | |
|---|---|---|
| JP | 11-213671 | 8/1999 |
| JP | 2002-537627 | 11/2002 |
| JP | 2004-234797 A | 8/2004 |
| JP | 2007-226883 | 9/2007 |
| JP | 2007-273548 | 10/2007 |

OTHER PUBLICATIONS

Liu et al., "Electric-Pulse-Induced Reversible Resistance Change Effect in Magnetoresistive Films", Applied Physics Letters, (2000), vol. 76, pp. 2749-2751.
Pagnia et al., "Bistable Switching in Electroformed Metal-Insulator-Metal Devices", Phys. Stat.sol. (a), vol. 108, pp. 11-65, (1988).
Dearnaley et al., "Electrical Phenomena in Amorphous Oxide Films", Rep. Prog. Phys., (1970), vol. 33, pp. 1129-1191.

(Continued)

*Primary Examiner* — Anh Phung
(74) *Attorney, Agent, or Firm* — Nixon & Vanderhye, P.C.

(57) ABSTRACT

A nonvolatile semiconductor memory device can carry out a forming process simultaneously on the nonvolatile variable resistive elements of memory cells and make the forming time shorter. The nonvolatile semiconductor memory device has a forming detection circuit provided between the memory cell array and the second selection line (bit line) decoder. The forming detection circuit detects the completion of the forming process for memory cells by measuring the fluctuation in the potential of second selection lines or the current flowing through the second selection lines when applying a voltage pulse for a forming process through the second selection lines simultaneously to the memory cells on which a forming process is to be carried out connected to the same first selection line (word line), and prevents a voltage from being applied to the second selection lines connected to the memory cells where the completion of the forming process is detected.

5 Claims, 13 Drawing Sheets

OTHER PUBLICATIONS

Baek et al., "Highly Scalable Non-Volatile Resistive Memory using Simple Binary Oxide Driven by Asymmetric Unipolar Voltage Pulses", IEDM Technical Digest, (2004), pp. 587-590.

Tamai et al., "RRAM Technology for Fast and Low-Power Forming/Switching", International Conference on Solid State Devices and Materials (SSDM), (2008), pp. 1166-1167.

* cited by examiner

CONTROL CIRCUIT FOR FORMING PROCESS ON NONVOLATILE VARIABLE RESISTIVE ELEMENT AND CONTROL METHOD FOR FORMING PROCESS

CROSS REFERENCE TO RELATED APPLICATION

This Nonprovisional application claims priority under 35 U.S.C. §119(a) on Patent Application No. 2009-061771 filed in Japan on 13 Mar., 2009 the entire contents of which are hereby incorporated by reference.

BACKGROUND OF THE INVENTION

1. Field of the Invention

The present invention relates to a control circuit for a forming process on a nonvolatile semiconductor memory device for storing information using nonvolatile variable resistive elements for efficiently carrying out the forming process required for the operation of the elements as nonvolatile variable resistive elements, as well as a control method for a forming process.

2. Description of the Related Art

In recent years, various device structures, such as FeRAMs (ferroelectric RAMS), MRAMs (magnetic RAMS) and OUMs (ovonic unified memories) have been proposed as next-generation nonvolatile random access memories (NVRAMs) which make high speed operation possible and substitute flash memories, and the competition is severe in the development of memories having higher performance, higher reliability, lower cost and process compatibility. However, these memory devices currently have both good and bad points, and we are far away from realizing an ideal "universal memory" having all the good points of SRAMs, DRAMs and flash memories.

In addition to these existing technologies, resistive random access memories (RRAM) using nonvolatile variable resistive elements having an electrical resistance that changes reversibly when a voltage pulse is applied have been proposed. The structure of these nonvolatile variable resistive elements is extremely simple and, as shown in FIG. 1, the nonvolatile variable resistive element 100 has a structure where a lower electrode 106, a variable resistor 104 and an upper electrode 102 are layered in sequence from the bottom, so that the resistive value changes reversibly when electrical stress, for example a voltage pulse, is applied across the upper electrode 102 and the lower electrode 106. A novel nonvolatile memory device that reads out the resistive value during the operation for reversibly changing the resistance (hereinafter referred to as "switching operation") can thus be implemented.

As for the material for the variable resistor 104, there is research by Shangquing Liu and Alex Ignatiev, among others, from Houston University, US, and U.S. Pat. No. 6,204,139 and Liu, S. Q. et al. "Electric-pulse-induced reversible Resistance change effect in magneto-resistive films", Applied Physics Letters, 2000, Vol. 76, p. 2749-2751 disclose a method for reversibly changing the electrical resistance by applying a voltage pulse to a Perovskite material, which is known to have colossal magneto-resistance effects. Here, in the element structure shown as an example in U.S. Pat. No. 6,204,139, a crystalline praseodymium calcium manganese oxide $Pr_{1-x}Ca_xMnO_3$ (PCMO) film, which is a Perovskite oxide, is used as the material for the variable resistor 104.

In addition, it is known from H. Pagnia et al. "Bistable Switching in Electroformed Metal-Insulator-Metal Devices", Phys. Stat. Sol. (a), 1988, vol. 108, p. 11-65 and Japanese Translation of International Patent Publication 2002-537627 that titanium oxide ($TiO_2$) films, nickel oxide (NiO) films, Zinc oxide (ZnO) films and niobium oxide ($Nb_2O_5$) films, which are oxides of transition metals, also exhibit reversible change in the resistance. When such transition metal oxides as titanium oxide and nickel oxide are used as variable resistors, a localized region where the resistivity is low (hereinafter referred to as "filament path") is created or decomposes in the oxide when the temperature rises, due to a current flowing into the nonvolatile variable resistive element, and this is believed to cause the resistance to change. The electrical properties of such filament paths are disclosed in G. Dearnaley et al. "Electrical phenomena in amorphous oxide films", Rep. Prog. Phys., 1970, Vol. 33, p. 1129-1191.

That is to say, nonvolatile variable resistive elements are initially in an isolated state after manufacture, and in order to convert them to a state in which they can be switched between a high resistance state and a low resistance state using electrical stress, it is necessary to form a filament path within the nonvolatile variable resistive element by applying a voltage, as shown in I. G. Baek et al., "Highly scalable non-volatile resistive memory using simple binary oxide driven by asymmetric unipolar voltage pulses", IEDM Technical Digest, 2004, p. 587-590. This process for forming a filament path within a nonvolatile variable resistive element is referred to as a forming process.

FIG. 2 shows the relationship between the level of the voltage pulse applied in the forming process and the thickness of the oxide (cobalt oxide) layer during the time required for a filament path to be formed, so that the forming process can be completed (hereinafter referred to as "forming time"), as shown in Y. Tamai et al. "RRAM Technology for Fast and Low-Power Forming/Switching", International Conference on Solid State Devices and Materials (SSDM), 2008, p. 1166. The higher the level of the applied voltage is and the thinner the oxide layer is, the shorter the forming time tends to be, and in the case where a forming voltage of 3 V is applied, the forming process completes in 1 μs for an oxide layer of 10 nm, while the forming process completes in 100 μs for 50 nm. Meanwhile, it is necessary to apply a voltage of as high as 20 V to oxide layers of 50 nm in order for the forming process to complete in 1 μs, and application of approximately 3 V is necessary for oxide layers of 10 nm.

Here, the forming time is the cumulative time over which a pulse is applied in the case where a voltage pulse is applied a number of times during the forming process.

As shown in FIG. 2, the forming time depends on the film thickness of the metal oxide for the variable resistor, and the nonvolatile variable resistive elements have different thicknesses, and therefore, there is inconsistency in the forming time between the elements. Therefore, a forming process, which is efficient for converting nonvolatile variable resistive elements to a state in which a switching operation is possible needs to be carried out on each individual element by adjusting the voltage.

However, at the stage of fabrication of memories having a practical size using memory cells with nonvolatile variable resistive elements, it takes too much time to carry out a forming process on each memory cell of the memory, and therefore, it is urgent to shorten the forming time, from the point of view of efficiency in mass production. Concretely, in the case where a forming process is carried out on a memory of 128 Mbytes, 1 us is necessary for the forming process on one memory cell (1 bit) with an applied voltage of 3 V in the case where the oxide film layer is 10 nm according to the value in Y. Tamai et al. "RRAM Technology for Fast and Low-Power Forming/Switching", International Conference on Solid State Devices and Materials (SSDM), 2008, p. 1166, and therefore, at least 15 minutes are required to carry out the forming process on each memory cell.

Here, though it is possible to increase the efficiency of the forming process so that the total forming time is shorter when a forming process is simultaneously carried out on a number of memory cells, it is necessary to solve the below described problems in order to do so.

FIG. 3 is an equivalent circuit diagram showing a memory cell array using nonvolatile variable resistive elements, and FIG. 4 shows an equivalent circuit of a unit memory cell. One terminal of a nonvolatile variable resistive element having two terminals is connected to the drain terminal of a selection transistor, and the other is connected to a second selection line (bit line; BL). The gate terminal of the selection transistor is connected to a first selection line (word line; WL) and the source terminal is connected to a third selection line (source line; SL).

In the memory cell array in FIG. 3, where the same memory cells as in FIG. 4 are aligned in a matrix, a voltage is applied through the first selection line WL1, so that the selection transistors are converted to an ON state, and a voltage pulse for a forming process is simultaneously applied to the second selection lines BL1 to BL5, so that a forming process is attempted to be carried out simultaneously on a number of nonvolatile variable resistive elements VR11 to VR15 of the memory cells that are connected to the first selection line WL1.

The time for the forming process is inconsistent between the nonvolatile resistive elements, and therefore, the first memory cell completes the forming process first. Here, it is assumed that the forming of the nonvolatile variable resistive element VR12 that is connected to the second selection line BL2 is completed first. The resistance lowers in the memory cell where the forming process is complete, and therefore, the current that flows through the second selection line BL2 increases due to the completion of the forming process on VR12, and the potential of the third selection line SL1 increases. Thus, the voltage required for the forming process stops being supplied to the other memory cells that are connected to the third selection line SL1, of which the potential has increased.

Furthermore, in the case where a voltage pulse for the forming process is generated in an internal circuit, the current that flows through the second selection line BL2 increases due to the completion of the forming process, and as a result, the voltage generated by the voltage generating circuit lowers as the demand exceeds the current driving performance of the voltage generating circuit. Therefore, the voltage required for the forming process stops being supplied to the other memory cells that are connected to the third selection line SL1.

As a result, the forming time prolongs, or the forming process makes no longer progresses.

SUMMARY OF THE INVENTION

The present invention is provided in view of the above described problems with the forming process for memory cell arrays for storing information using nonvolatile variable resistive elements having a two-terminal structure, and a first object thereof is to provide a nonvolatile semiconductor memory device where the forming time can be shortened by carrying out a forming process simultaneously on a number of memory cells, and a second object is to provide a control method according to which a forming process can be carried out simultaneously on a number of memory cells.

The nonvolatile semiconductor memory device according to the present invention is a nonvolatile semiconductor memory device having a memory cell array where memory cells are aligned in a matrix, each memory cell being formed by connecting one terminal of a nonvolatile variable resistive element with two terminals having electrodes at both ends of a variable resistor to one terminal of a selection element with two terminals for controlling the current flowing through the selection element through application of a voltage across the two terminals, or one of the two terminals other than a control terminal of a selection element with three terminals for controlling the current flowing between the two terminals through application of a current or a voltage to the control terminal, first characterized in that the memory cells are connected to each other within the memory cell array through first selection lines extending in a direction of rows for connecting the memory cells in the same row, and second selection lines extending in a direction of columns for connecting the memory cells in the same column, a forming process makes the nonvolatile variable resistive element transit between two or more different resistance states when electrical stress is applied across the two terminals of the nonvolatile variable resistive element, so that one resistance state after the transition can be used for storing information, a forming detection circuit is provided to detect completion of the forming process to which a forming voltage for the forming process is to be applied when a plurality of nonvolatile variable resistive elements connected to the same first selection line on which the forming process is to be carried out are selected by applying a current or a voltage to the corresponding selection elements through the first selection line, and the forming voltage is simultaneously applied to the selected nonvolatile variable resistive elements through different second selection lines, and the forming detection circuit is configured to prevent the forming voltage from being applied to the second selection lines connected to the nonvolatile variable resistive elements for which the completion of the forming process is detected.

Furthermore, the nonvolatile semiconductor memory device according to the present invention has the structure according to the first characteristic, and is second characterized in that the selection element is a selection element with three terminals, and each of the memory cells is formed such that the control terminal of the selection element is connected to the first selection line, either one terminal of the nonvolatile variable resistive element having no connection to the selection element or one terminal other than the control terminal of the selection element having no connection to the nonvolatile variable resistive element is connected to the second selection line and the other is connected to the third selection line, and the forming voltage is applied between the second selection line and the third selection line.

Furthermore, the nonvolatile semiconductor memory device according to the present invention has the structure according to the first characteristic, and is third characterized in that the selection element is a selection element with two terminals, each of the memory cells is formed such that either one terminal of the nonvolatile variable resistive element having no connection to the selection element or one terminal of the selection element having no connection to the nonvolatile variable resistive element is connected to the first selection line and the other is connected to the second selection line, and the forming voltage is applied between the first selection line and the second selection line.

Furthermore, the nonvolatile semiconductor memory device according to the present invention has the structure according to any of the above described first to third characteristics, and is fourth characterized in that, when detecting a fluctuation in the current flowing through a predetermined point along the second selection line or the potential at a predetermined point along the second selection line due to the completion of the forming process, the forming detection circuit stops application of the forming voltage through the second selection line for which fluctuation in the current or the potential is detected, and the forming detection circuit is connected to the second selection line to which the forming voltage is applied, directly or through a decoder for the second selection lines.

The control method for a forming process according to the present invention is a control method for a forming process on a nonvolatile variable resistive element in a nonvolatile semiconductor memory device, the nonvolatile semiconductor memory device comprising a memory cell array where memory cells are aligned in a matrix, each memory cell being formed by connecting one terminal of a nonvolatile variable resistive element with two terminals having electrodes at both ends of a variable resistor to one terminal of a selection element with two terminals for controlling the current flowing through the selection element through application of a voltage across the two terminals, or one of the two terminals other than a control terminal of a selection element with three terminals for controlling the current flowing between the two terminals through application of a current or a voltage to the control terminal, first characterized in that the memory cells are connected to each other within the memory cell array through first selection lines extending in the direction of rows for connecting the memory cells in the same row, and second selection lines extending in the direction of columns for connecting the memory cells in the same column, a forming process makes the nonvolatile variable resistive element transit between two or more different resistance states when electrical stress is applied across the two terminals of the nonvolatile variable resistive element, so that one resistance state after the transition can be used for storing information, the control method for the forming process comprises: selecting one first selection line having a connection to the memory cells on which the forming process is to be carried out within the memory cell array; selecting the second selection lines individually having connection to the memory cells on which the forming process is to be carried out within the memory cell array; applying a forming voltage for the forming process simultaneously to the selected second selection lines; detecting fluctuation in the current flowing through a predetermined point along the second selection line or the potential at a predetermined point along the second selection line due to completion of the forming process; and preventing the forming voltage from being applied to the second selection line for which the fluctuation in the current or potential is detected, and the forming process is carried out simultaneously on the nonvolatile variable resistive elements of the memory cells having connection to the same first selection line.

The present invention allows a nonvolatile semiconductor memory device having a memory cell array where unit memory cells each having a nonvolatile variable resistive element with two terminals and a selection element are aligned in a matrix to be provided with a control means for detecting the completion of a forming process on memory cells having individual connection to a second selection line, and preventing a voltage pulse for a forming process from being applied through the second selection line having connection to the memory cell for which the completion of the forming process is detected, so that the fluctuation in the potential of the second selection line due to the completion of the forming process is reset, and the voltage required for the forming process can be supplied to the nonvolatile variable resistive elements of other memory cells where the forming process has not yet completed.

Here, the selection elements are selection elements with three terminals, for example transistors, or selection elements with two terminals, for example diodes or barristers, and select a number of memory cells on which a forming process is to be carried out by applying a voltage to selection elements through a first selection line. Then, a voltage pulse for a forming process is applied simultaneously to the selected memory cells on which the forming process is to be carried out through a second selection line, so that the forming process can be carried out.

Concretely, a circuit for detecting fluctuation in the current that flows through the second selection line that is connected to a memory cell on which the forming process is completed or the potential of the second selection line and stopping application of a voltage pulse for a forming process through the second selection line from which the fluctuation in the current or potential is detected is provided and controlled so that no voltage is applied to the nonvolatile variable resistive elements on which a forming process is completed through a second selection line. As a result, the voltage required for the forming process can be supplied to the nonvolatile resistive elements of the memory cells on which the forming process is not complete, irrespectively of whether or not the forming process is complete for other memory cells on which a forming process is to be carried out. Here, the circuit can be formed by connecting circuits where a logic circuit and a transistor are combined to different second selection lines.

Accordingly, a forming process can be carried out simultaneously and collectively on a number of memory cells that are connected to the same first selection line, and thus, it is possible to shorten the forming time.

DETAILED DESCRIPTION OF THE INVENTION

In the following, the circuit configuration of the nonvolatile semiconductor memory device according to the present invention, the memory cell array and the control method for a forming process on nonvolatile variable resistive elements are described in reference to the drawings.

First Embodiment

Figure 5:
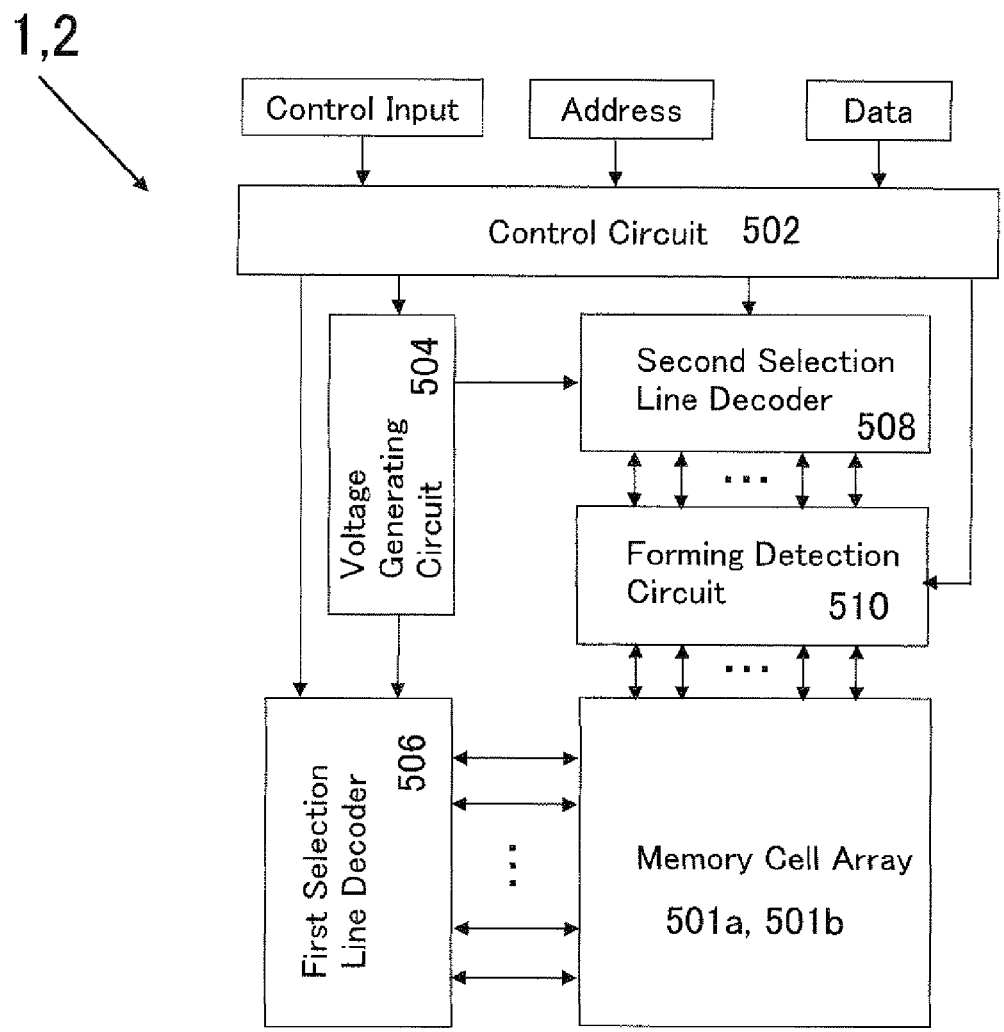
FIG. 5 is a block diagram showing the configuration of the nonvolatile semiconductor memory device according to the first and third embodiments of the present invention.

FIG. 5 is a circuit diagram showing the configuration of the nonvolatile semiconductor memory device (hereinafter referred to as "device 1 of the present invention") according to an embodiment of the present invention. The present memory device is formed of a memory cell array 501a, a control circuit 502, a voltage generating circuit 504, a first selection line decoder 506, a second selection line decoder 508 and a forming detection circuit 510.

Figure 1:
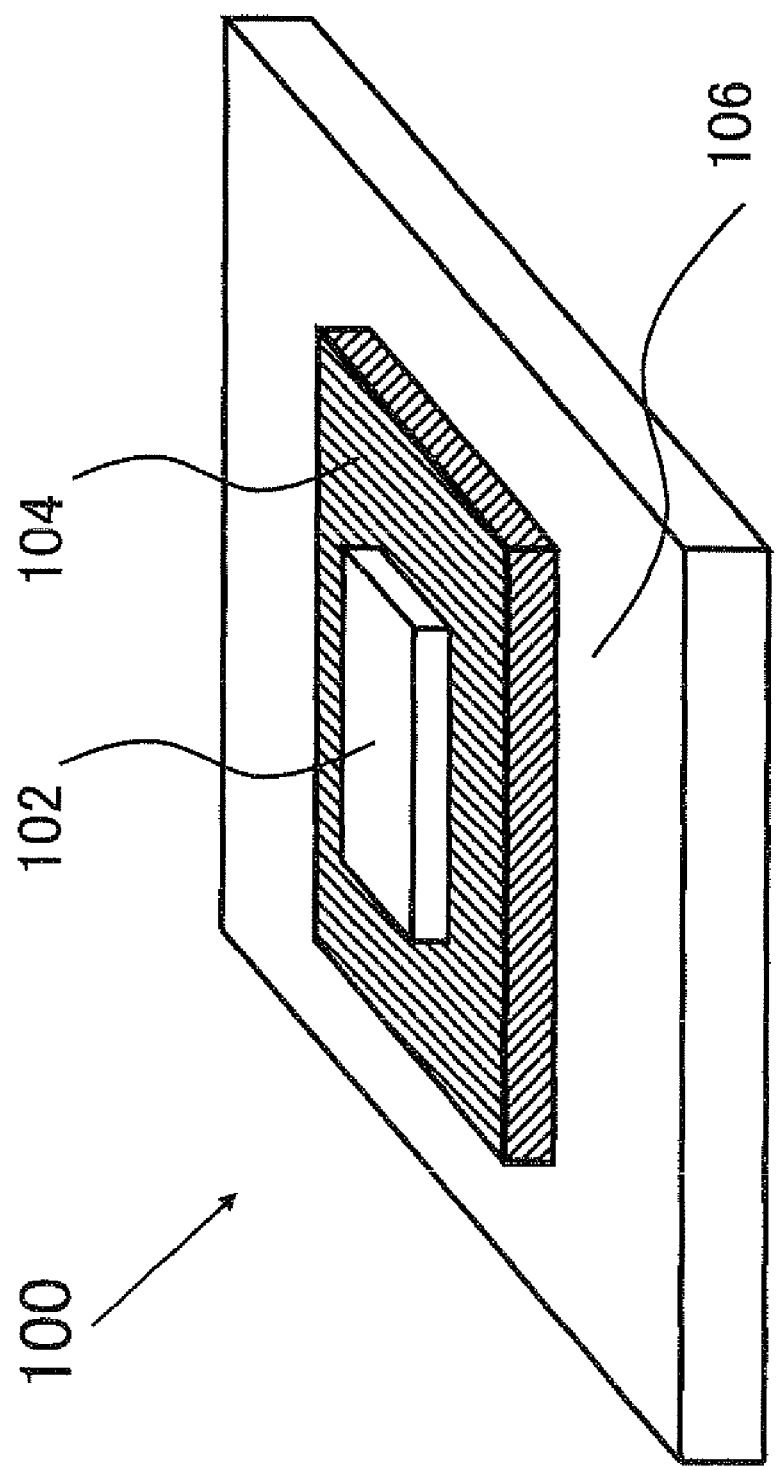
FIG. 1 is a diagram showing the structure of a nonvolatile variable resistive element.
Figure 2:
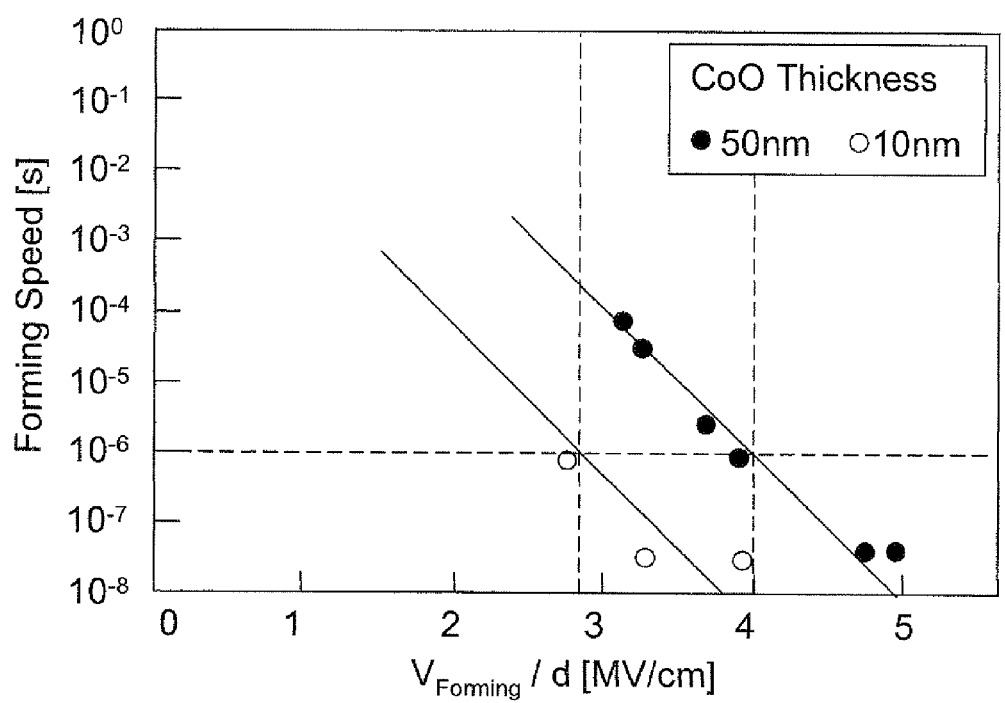
FIG. 2 is a graph showing the relationship between the time required for the forming process and the voltage applied in a forming process and the film thickness of the variable resistor.
Figure 3:
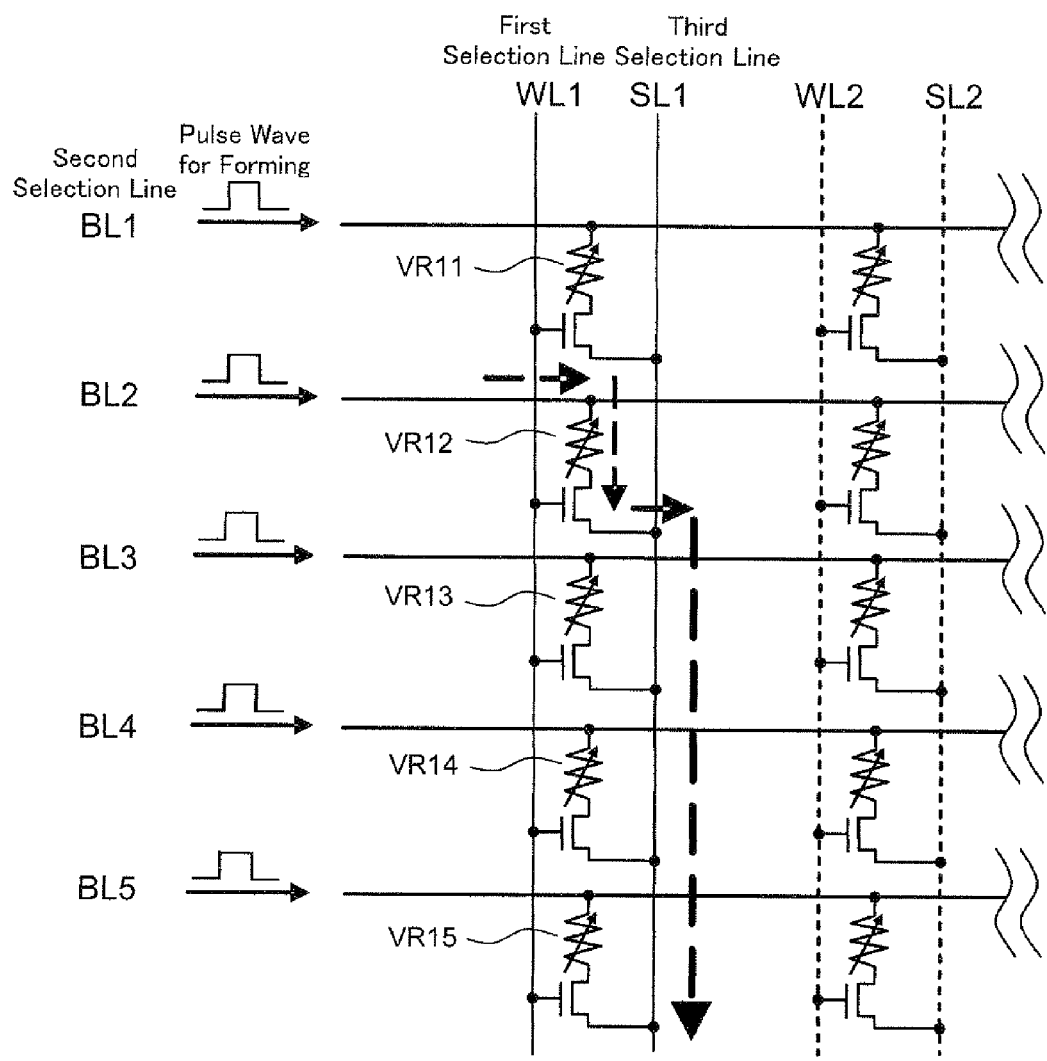
FIG. 3 is an equivalent circuit diagram showing a memory cell array using nonvolatile variable resistive elements, as well as problems with conventional control methods for a forming process.
Figure 4:
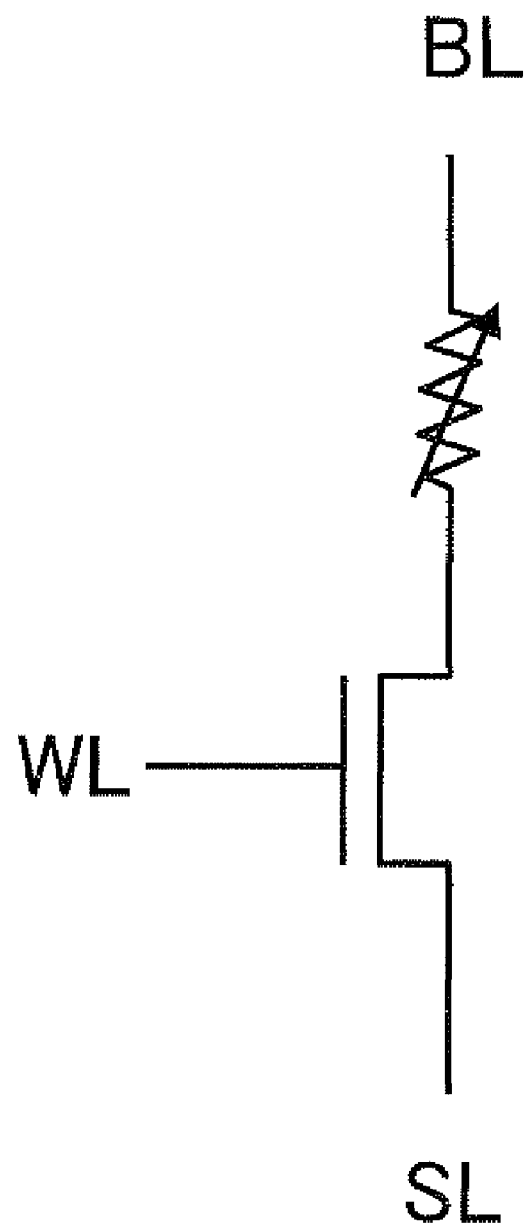
FIG. 4 is an equivalent circuit diagram showing a memory cell using a nonvolatile variable resistive element.

The memory cell array 501a is shown in the equivalent circuit diagram of FIG. 3, and has memory cells including a nonvolatile variable resistive element and a selection transistor that are aligned in a matrix. Here, the nonvolatile variable resistive elements are nonvolatile variable resistive elements with two terminals having electrodes at both ends of a variable resistor, and electrical stress is applied across the two terminals of the nonvolatile variable resistive elements when a forming process is carried out, so that the variable resistive elements can transit between two or more different resistance states, and thus one resistance state after transition can be used for storing information. The selection transistors are MOS transistors, for example, and one terminal of a nonvolatile variable resistive element and the drain terminal of a selection transistor are connected so as to form a memory cell. The gate terminals of the selection transistors are connected to first selection lines (word lines) that extend in the direction of rows, so that memory cells in the same row are connected to each other by means of the first selection lines. The other terminal of the nonvolatile variable resistive element that is not connected to the selection transistor is connected to a second selection line (bit line) that extends in the direction of columns, so that memory cells in the same column are connected to each other by means of the second selection lines. The source terminals of the selection transistors are connected to the third selection lines (source lines) which extend in the direction of rows, so that memory cells in the same row are connected to each other by means of the third selection lines. Either a first selection voltage or a first non-selection voltage is applied through a first selection line, and either a second selection voltage or a second non-selection voltage is applied through a second selection line, so that one memory cell that is designated through an address input from the outside can be selected for the operation when write-in, erasure, readout or a forming process is carried out. Here, though in the present embodiment, the third selection lines are grounded during operation, a minuscule bias voltage that is slightly higher than the ground voltage may be applied.

Here, oxides of a transition metal, such as Ti, Fe, Co, Ni, Zr, Nb, Hf or Ta, are possible as the material for the variable resistors used in the above described memory cell array 501a, and Al, Ti, Cu, Ag, Ta, W, Pt and TiN are possible as the material for the electrodes. In the above described memory cell array 501a, for example, the material for the variable resistors is cobalt oxide, both electrodes of the nonvolatile variable resistive elements are formed of an electrode material TiN, and the device structure, including selection transistors, is appropriately designed so that elements having a size of approximately 0.4 μmφ can be fabricated in accordance with well-known, standard process technologies. Concrete descriptions for the device structure and manufacturing method are omitted.

The control circuit 502 controls the memory operation, including write-in, erasure and readout, of the memory cell array 501a, and also controls the forming process. Concretely, the control circuit 502 controls the first selection line decoder 506 and the second selection line decoder 508 on the basis of an address signal inputted from an address line, a data input inputted from a data line and a control input signal inputted from a control signal line, so that the memory operation and forming process for the memory cells can be controlled. Concretely, this is a circuit having the function of an address buffer circuit, a data input/output buffer circuit and a control input buffer circuit.

The voltage generating circuit 504 generates a first selection voltage that is required for selecting a memory cell for which a forming process is to be carried out, and a first non-selection voltage for not selecting memory cells for which a forming process is not to be carried out, and supply these to the first selection line decoder 506 during the forming process for memory cells. In addition, the voltage generating circuit 504 generates a voltage pulse for a forming process on the memory cell selected for the forming process and supplies it to the second selection lien decoder 508. In addition, the voltage generating circuit 504 generates the voltages required to be applied during the write-in, erasure and readout operation and supplies them to the first selection line decoder 506 and the second selection line decoder 508.

The first selection line decoder (word line decoder) 506 selects a first selection line corresponding to the address signal inputted into the address line when a signal is inputted into an address line so as to designate a memory cell for which a forming process is to be carried out, and applies the first selection voltage and the first non-selection voltage to the selected first selection line and unselected first selection lines, respectively during the forming operation for the memory cell array 501a. Concretely, a voltage is applied to the selected first selection line, so that only the selection transistors connected to the selected first selection line are converted to an ON state. In addition, the first selection line decoder 506 is used to select a first selection line corresponding to the write-in, erasure or readout operation during operation.

The second selection line decoder (bit line decoder) 508 selects the second selection line corresponding to an address signal for column selection that is inputted into the address line when a signal is inputted into an address line so as to designate the memory cell for which a forming process is to be carried out, and applies a voltage pulse for a forming process through the selected second selection line during the forming operation of the memory cell array 501a. In addition, the second selection line decoder 508 is used to select a second selection line corresponding to the write-in, erasure or readout operation during operation.

The forming detection circuit 510 is located between the memory cell array 501a and the second selection line decoder 508, for example, and detects fluctuation in the current flowing through a second selection line or the potential of a second selection line as the resistance of the nonvolatile variable resistive element of a memory cell lowers due to the completion of the forming process. Concretely, the forming detection circuit 510 has a function of cutting the current path along the second selection line connected to the memory cell where the forming process is complete between the voltage generating circuit and the memory cell array when detecting fluctuation in the potential of the second selection line that is connected to the memory cell on which a forming process is to be carried out, for example.

Figure 6:
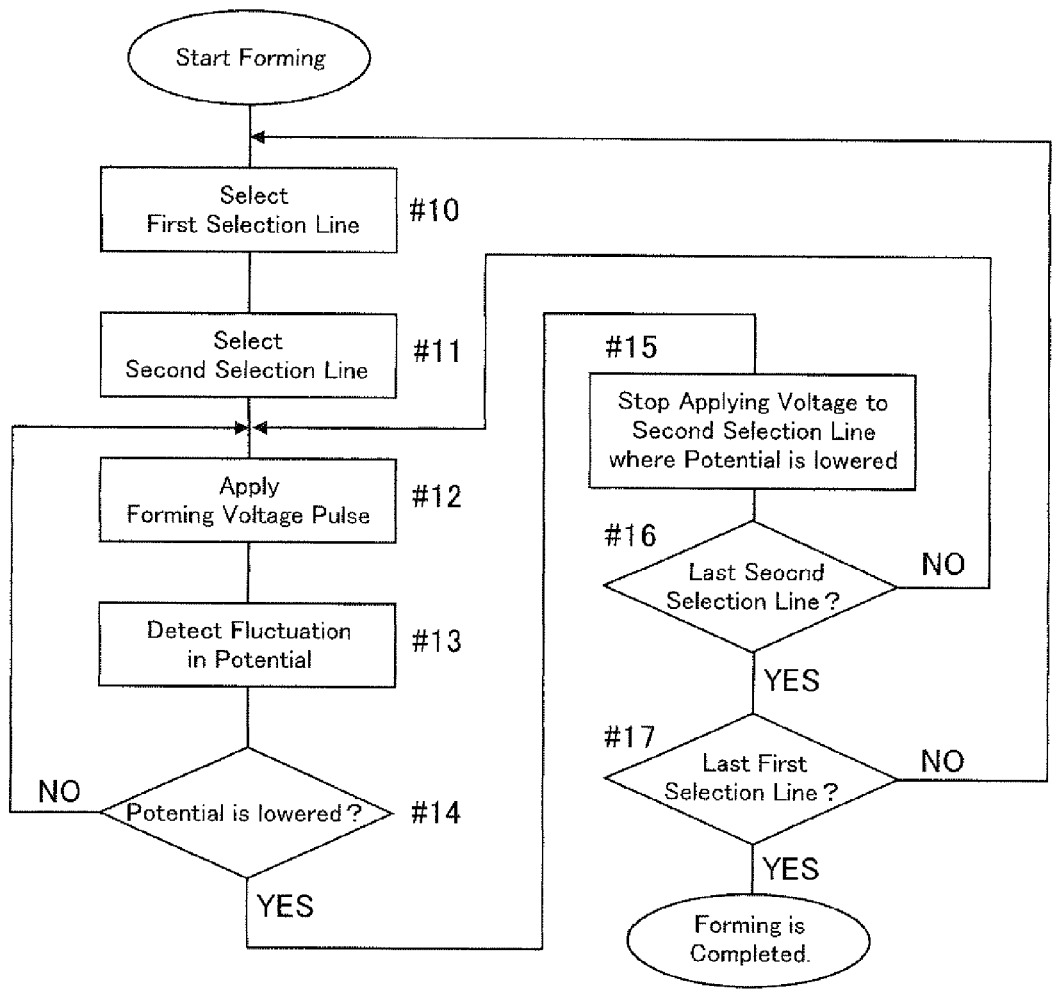
FIG. 6 is a flow chart showing the control method for a forming process according to the present invention.

The device 1 of the present invention can operate as follows, for example, so that a forming process can be efficiently carried out on a memory cell. FIG. 6 is a flow chart showing the control method for a forming process according to the present invention.

First, one first selection line (word line) is selected (#10). The voltage generating circuit 504 generates a first selection voltage and a first non-selection voltage, and the first selection line decoder 506 applies the first selection voltage to the gate terminals of the selection transistors in the memory cells that are connected to the selected first selection line, and applies the first non-selection voltage to the gate terminals of the selection transistors in the memory cells that are connected to the non-selected first selection lines. As a result, a current can flow only through the nonvolatile variable resistive elements of the memory cells that are connected to the selected first selection line.

Next, a number of second selection lines (bit lines) are selected (#11). Here, all of the second selection lines within the memory cell arrays are selected. The voltage generating circuit 504 generates a voltage pulse for a forming process, and the second selection line decoder 508 applies a voltage pulse for a forming process simultaneously through all of the selected second selection lines, so that a current flows into the third selection line (a source line) through the selected second selection lines (#12).

When the forming process for a memory cell is complete, the resistance of the nonvolatile variable resistive element in the memory cell where the forming process is complete lowers, and the current that flows through the second selection line that is connected to the memory cell where the forming process is complete increases. Therefore, in the case where a voltage pulse having a positive (or negative) polarity is applied to the selected second selection lines, the potential of the third selection lines increases (or lowers) due to the effects of the parasitic resistance of the third selection lines. At the same time, the potential of the second selection lines that are connected to the memory cells where the forming process is complete lowers (or increases) due to the effects of a load circuit, for example a transistor, along a voltage pulse application path, for example the second selection line decoder 508.

The forming detection circuit 510 detects fluctuation in the potential of the second selection lines that are connected to the memory cells where a forming process is completed (#13 to #14). When the fluctuation in the potential is detected, it can be determined that a forming process for the memory cell that is connected to the second selection lines where the fluctuation in the potential is detected is complete.

Next, control is carried out so that the voltage stops being applied to the memory cells where the forming process is complete (#15). This can be achieved when the forming detection circuit 510 cuts the current path along the second selection lines that are connected to the memory cells where the forming process is complete.

As a result, no current flows through the memory cells where the forming process is complete, and thus, the potential of the third selection lines can be prevented from fluctuating, and a current that exceeds the drive performance of the voltage generating circuit 504 can be prevented from flowing through the second selection lines, and therefore, the voltage required for the forming process can be supplied to the nonvolatile variable resistive elements of a number of memory cells where the forming process is not yet complete. As a result, it becomes possible to carry out a forming process simultaneously and collectively on the memory cells that are connected to a number of bit lines.

When the forming process on the memory cells that are connected to all of the selected second selection lines is complete (#16), the first next selection line is selected, and in addition, all of the second selection lines are selected, so that a forming process can be carried out simultaneously and collectively on a number of memory cells that are connected to the newly selected first selection line. By repeating this, a forming process can be efficiently carried out on all of the memory cells within the memory cell array of which the addresses are designated by the first selection lines and the second selection lines.

Figure 7:
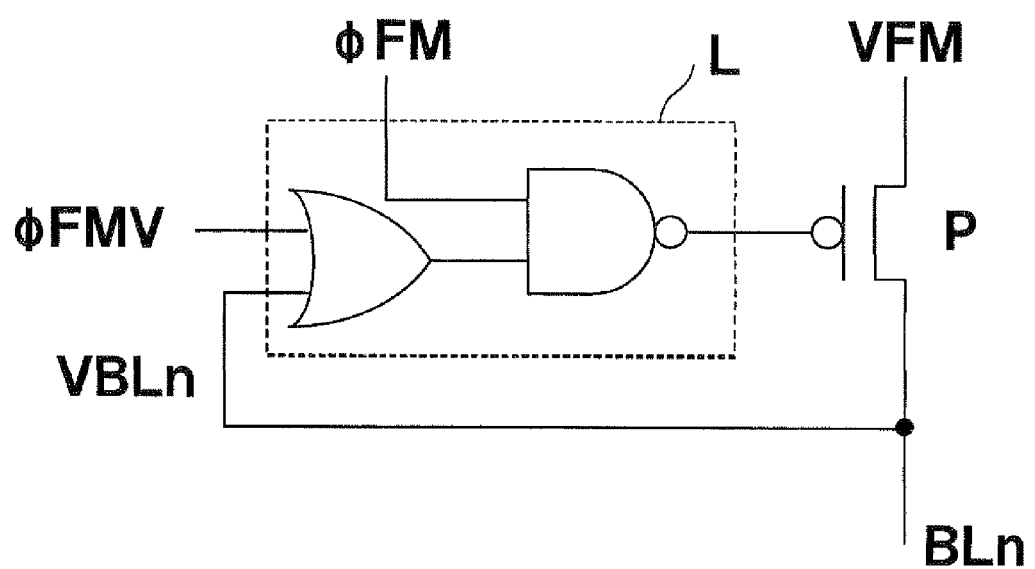
FIG. 7 shows an example of the structure of the forming detection circuit according to the present invention.

FIG. 7 shows an example of the configuration of a forming detection circuit, and the same combinations of the circuit L and the p type MOS transistor P as in FIG. 7 are provided on the respective second selection lines BLn and make connection between the memory cell array 501a and the second selection line decoder 508. The path through which the voltage pulse VFM for the forming process is applied and the second selection line BLn are connected to the source terminal and the drain terminal of the transistor P, respectively. The gate terminal of the transistor P is connected to the output of the circuit L, so that three input signals: a forming start signal φFM, a potential fluctuation checking start signal φFMV and a second selection voltage signal VBLn control the current that flows between the source and the drain of the transistor P.

Figure 8:
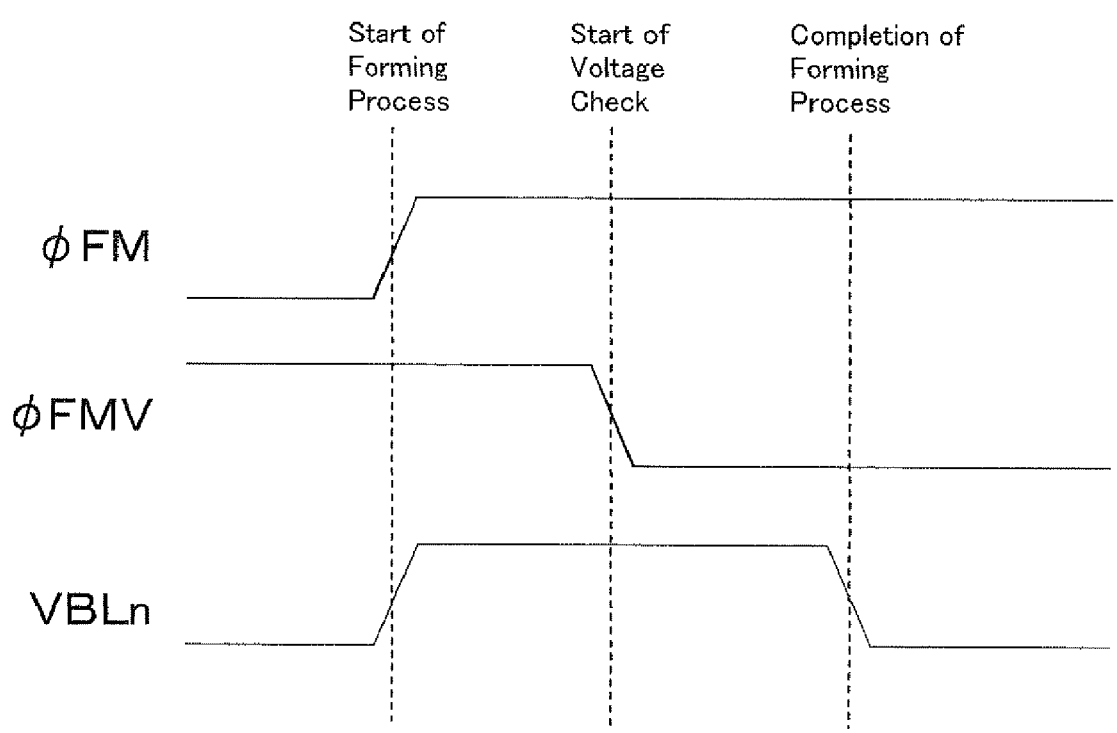
FIG. 8 is a timing chart for the forming detection circuit according to the present invention during the forming operation.

FIG. 8 shows a timing chart for the control signals φFM, φFMV and VBLn during the forming process. Before the start of forming, φFM is in an OFF state, and therefore, the transistor P is in also an OFF state, and the second selection line BLn is in such a state as to be electrically disconnected by the transistor P. Therefore, VBLn is in an OFF state (floating).

First, φFM and φFMV are in an ON state when the forming process starts, and a forming voltage pulse is applied to the transistor P in an ON state. Next, φFMV is converted to an OFF state in order to detect fluctuation in the potential along the second selection line BLn. At this time, VBLn is in an OFF state, and no voltage is applied to the gate terminal of the transistor P in the case where VBLn is low due to the completion of the forming process, and therefore, no current flows between the source and the drain of the transistor, and the second selection line BLn is electrically disconnected. As a result, the voltage pulse VFM for the forming process stops being applied to the second selection lines connected to the memory cells where the forming is complete. Here, during the write-in, erasure and readout operation of the memory, the detection circuit may be bypassed, or a voltage for the memory operation may be applied in such a state that φFM and φFMV are in an ON state.

Figure 9:
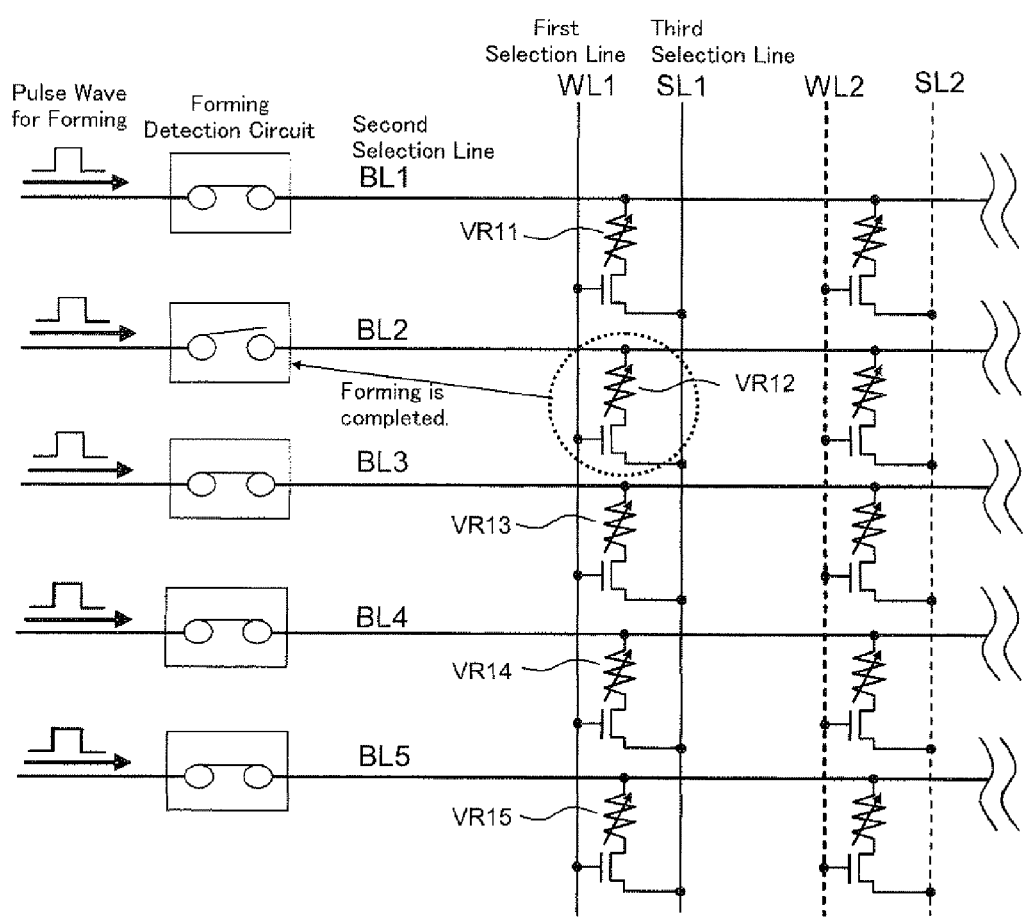
FIG. 9 is an equivalent circuit diagram showing the memory cell array according to the first embodiment of the present invention, as well as the operation of the forming process according to the present invention.

FIG. 9 shows an example where the circuits in FIG. 7 are attached to the respective second selection lines in the memory cell array in FIG. 3. In FIG. 9, selection transistors are converted to an ON state by applying a first selection voltage through a first selection line WL1, and a positive voltage pulse for a forming process is applied simultaneously to the second selection lines BL1 to BL5, so that a forming process is attempted to be carried out simultaneously and collectively on the memory cells that are connected to the selected first selection line WL1.

Here, in the case where the forming process on the memory cells that are connected to the second selection line BL2 is complete before the forming process on the memory cells that are connected to the other selection lines BL1 and BL3 to BL5 is complete, the nonvolatile variable resistive elements VR12 in the memory cells where the forming process is complete changes from the insulating state to a low resistance state of approximately 1 MΩ or less, and therefore, the current flowing through the second selection line BL2 increases, and the potential of the third selection line SL1 also increases, due to the effects of the parasitic resistance on the third selection lines side. At the same time, the potential of the second selection line BL2 that is connected to the memory cells where the forming process is complete lowers, due to the effects of the parasitic resistance of the second selection line decoder.

The forming detection circuit 510 formed of the circuit L and the p type MOS transistor P electrically disconnects the second selection line BL2 from the memory cells when detecting the fall in the potential of the second selection line BL2. As a result, the increase in the potential of the third selection line SL1 stops, and it becomes possible to supply the voltage required for the original forming process to the nonvolatile variable resistive elements in the memory cells that are connected to SL1 and BL3 to BL5, so that the forming process can be resumed.

When the forming process is controlled as described above, the time required for the forming process for all of the memory cells that are connected to the same selected first selection line can be made as short as the longest time required for the forming process to be carried out on the nonvolatile variable resistive element in one memory cell.

In the present embodiment, the time t required for the forming process is $t \approx N_W \times t_0$ when the forming time for each memory cell is $t_i$ seconds, the longest required time is $t_0$ (=max $\{t_i\}$) seconds and the number of first selection lines (word lines) is $N_W$. Thus, the time can be shortened to one divided by the number of second selection lines (bit lines), as compared to the forming time required in accordance with the prior art. Accordingly, the greater the capacitance of the memory cells is and the greater the number of second selection lines is, the more significant the difference in the time required for forming becomes, and the time can be expected to be shorter by 90% or more when the memory has a practical capacity.

Second Embodiment

The nonvolatile semiconductor memory device according to another embodiment of the present invention (hereinafter referred to as "device 2 of the present invention") has the structure shown in the circuit diagram in FIG. 5, as does the device 1 of the present invention according to the first embodiment, but the structure of the memory cell array is different from that in the device 1 of the present invention. The device 3 of the present invention is formed of a memory cell array 501b, a control circuit 502, a voltage generating circuit 504, a first selection line decoder 506, a second selection line decoder 508 and a forming detection circuit 510, and the structure and operation of the control circuit 502, the voltage generating circuit 504 and the forming detection circuit 510 are exactly the same as in the device 1 of the present invention, and therefore, the descriptions are not repeated.

Figure 10:
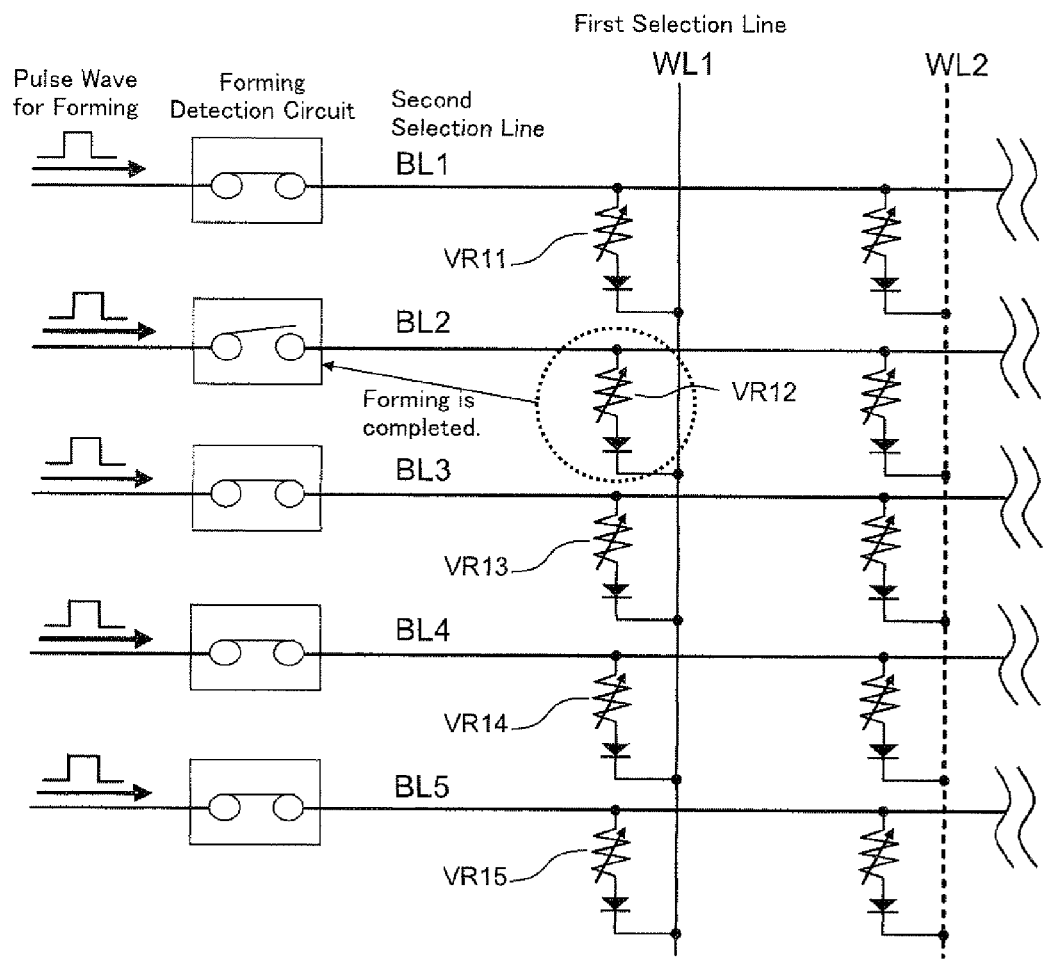
FIG. 10 is an equivalent circuit diagram showing the memory cell array according to the second embodiment of the present invention, as well as the operation of the forming process according to the present invention.
Figure 11A:
FIG. 11 is an equivalent circuit diagram showing memory cells according to the second embodiment of the present invention.

The memory cell array 501b is shown in the equivalent circuit diagram in FIG. 10, and a memory cell array having a cross point structure, where memory cells including a nonvolatile variable resistive element and a selection diode are aligned in a matrix. Here, the nonvolatile variable resistive elements are nonvolatile variable resistive elements with two terminals that have electrodes at both ends of a variable resistor, and when a forming process is carried out on the nonvolatile variable resistive elements, they can transit between two or more different resistance states by applying electrical stress across the two terminals, so that one resistance state after transition can be used for storing information. One terminal of the nonvolatile variable resistive element and one terminals of the selection diode are connected to form a memory cell with two terminals. FIG. 11A is an equivalent circuit diagram showing a memory cell. The terminal of the selection diode that is not connected to the nonvolatile variable resistive element is connected to a first selection line that extends in the direction of rows, and memory cells in the same row are connected to each other by means of first selection lines. The terminal of the nonvolatile variable resistive element that is not connected to the selection diode is connected to a second selection line that extends in the direction of columns, and memory cells in the same column are connected to each other by means of second selection lines. During the write-in, erasure, readout or forming process operation, one memory cell that is designated by an address input from the outside can be selected for the operation by applying either a first selection voltage or a first non-selection voltage through the first selection lines and either a second selection voltage or a second non-selection voltage through second selection lines.

Here, oxides of a transition metal, such as Ti, Fe, Co, Ni, Zr, Nb, Ta or Hf, are possible as the material for the variable resistors used in the above described memory cell array 501b, and Al, Ti, Cu, Ag, Ta, W, Pt and TiN are possible as the material for the electrodes. In the above described memory cell array 501a, for example, the material for the variable resistors is cobalt oxide, both electrodes of the nonvolatile variable resistive elements are formed of an electrode material TiN, and the device structure, including selection transistors, is appropriately designed so that elements having a size of approximately 0.4 μmφ can be fabricated in accordance with well-known, standard process technologies. Concrete descriptions for the device structure and manufacturing method are omitted.

The first selection line decoder 506 selects the first selection line that corresponds to the address signal inputted into the address line when a signal is inputted into the address line so as to designate the memory cell on which a forming process is to be carried out during the forming process for the memory cell array, and applies a first selection voltage and a first non-selection voltage to the selected first selection line and the unselected first selection lines, respectively. Concretely, a positive voltage is applied to the unselected first selection lines so that a voltage is applied to the selection diodes that are connected to the unselected first selection lines in the backward direction, and thus, a voltage is applied to the selection diodes that are connected to the selected first selection line in the forward direction. In addition, the first selection line decoder 506 is used to select a first selection line in accordance with the write-in, erasure or readout operation.

The second selection line decoder 508 selects the second selection line corresponding to the address signal for selecting a column that is inputted into the address line when a signal is inputted into an address line so as to designate a memory cell on which a forming process is to be carried out during the forming process for the memory cell array, and applies a voltage pulse for a forming process through the selected second selection line so that a current flows from the second selection line to the first selection line. In addition, the second selection line decoder 508 is used to select a second selection line in accordance with the write-in, erasure or readout operation.

Like the device 1 of the present invention, the above described device 2 of the present invention selects one first selection line and a number of second selection lines, as shown in FIG. 6, so that a voltage pulse for a forming process can be simultaneously applied to all of the selected second selection lines, and thus, a current flows from the selected second selection lines to the first selection line, and the forming detection circuit detects fluctuation in the potential of the second selection lines that are connected to the memory cells where the forming process is complete, and such control is carried out that the voltage stops being applied to the memory cells where the forming process is complete through the second selection lines, and as a result, the forming process can be carried out efficiently.

Here, the above described embodiments are examples of preferred embodiments of the present invention. The embodiments of the present invention are not limited to these, and various modifications are possible within such a scope as not to deviate from the gist of the present invention.

Other Embodiments

In the following, other embodiments of the present invention are described.

(1) Though in the first embodiment described above, the third selection lines (source lines) extend in the direction of rows and have a structure that connects memory cells in the direction of rows, they may extend in the direction of columns so as to connect memory cells in the direction of columns. In addition, the third selection lines may be connected to other common wires. Furthermore, as shown in FIG. 12, a third selection line decoder (source line decoder) 509 may be added in the structure of the device 1 of the present invention according to the first embodiment so as to provide a structure that allows the voltage required for the write-in, erasure, readout and forming process operation to be applied via the third selection lines.

Figure 12:
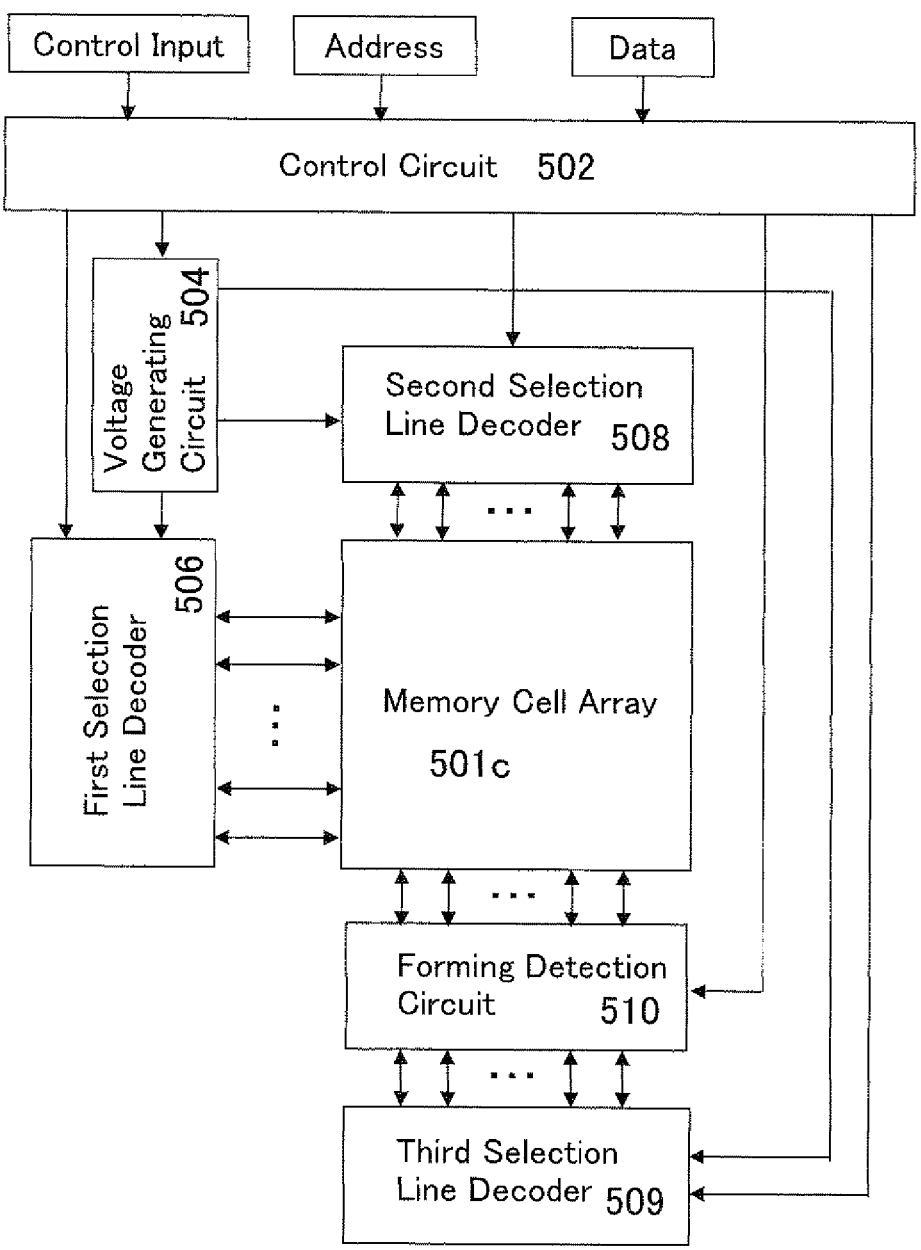
FIG. 12 is a block diagram showing the configuration of the nonvolatile semiconductor memory device according to another embodiment of the present invention.

FIG. 12 is a circuit diagram showing the configuration of the nonvolatile semiconductor memory device according to another embodiment of the present invention (hereinafter referred to as device 3 of the present invention). The memory cell array 501c has a slightly different structure from the memory cell array 501a, and the third selection lines extend in the direction of columns instead of the direction of rows so as to connect memory cells in the direction of columns. One memory cell that is designated by an address input from the outside can be selected for the forming process and the write-in, erasure or erasure operation by applying either the first selection voltage or the first non-selection voltage through the first selection lines, either a second selection voltage or a second non-selection voltage through the second selection lines, and either a third selection voltage or a third non-selection voltage through the third selection lines separately. The control circuit 502 controls the first selection line decoder 506, the second selection line decoder 508 and the third selection line decoder 509 on the basis of the address signal inputted from an address line, the data input inputted from a data line and the control input signal inputted from a control signal line so as to control the memory operation for each memory cell and the forming process. The voltage generating circuit 504 generates the voltages required for the write-in, erasure or readout operation and the forming process, and supplies them to the first selection line decoder 506, the second selection line decoder 508 and the third selection line decoder 509. The third selection line decoder 509 selects the third selection line corresponding to the address signal inputted into an address line when a signal is inputted into the address line so as to designate a memory cell for the forming process for a memory cell and the write-in, erasure or readout operation, and applies the third selection voltage and the third non-selection voltage through the selected third selection line and the unselected third selection lines, respectively, in such a manner that the voltage is appropriate for operation. The first selection line decoder 506 and the second selection line decoder 508 operate in the same manner as in the device 1 of the present invention during the forming process and the write-in, erasure and readout operation, and thus, the descriptions thereof are not repeated.

The forming detection circuit 510 is provided between the memory cell array 501c and the third selection line decoder 509, for example, and detects the fluctuation in the current that flows through the third selection lines or the potential in the third selection lines as the resistance of the nonvolatile variable resistive element in the memory cells lowers due to the completion of the forming process. Concretely, when fluctuation is detected in the potential of the third selection line that is connected to the memory cell on which a forming process is to be carried out, the current path is disconnected along the third selection line that is connected to the memory cells where the forming process is complete. As a result, no current flows through the memory cells where the forming process is complete, and the voltage required for the forming process can be supplied to the nonvolatile variable resistive elements of a number of memory cells where the forming process is not complete.

Like the device 1 of the present invention, the above described device 3 of the present invention selects one first selection line (word line) and a number of second selection lines (bit lines) so that a voltage pulse for a forming process can be simultaneously applied through all of the selected second selection lines, and a current flows to the third selection lines (source lines) from the selected second selection lines, and thus, the forming detection circuit detects the fluctuation in the potential of the third selection lines that are connected to the memory cells where the forming process is complete, and such control is carried out that a voltage stops being applied to the memory cells where the forming process is complete through the second selection line, and thus, the forming process can be carried out efficiently, as shown in FIG. 6.

(2) Though in the above described first and other embodiments, the second selection lines are bit lines and the third selection lines are source lines in the description of an exemplary structure, so that a voltage pulse for a forming process can be applied through the bit lines, and the fluctuation in the potential of the bit lines and the source lines is detected as the resistance of the nonvolatile variable resistive elements in the memory cells where the forming process is complete lowers, a structure where the second selection lines are source lines and the third selection lines are bit lines is also possible, so that a voltage pulse for a forming process can be applied through the source lines and the fluctuation in the potential of the source lines and the bit lines can be detected as the resistance of the nonvolatile variable resistive elements in the memory cells where the forming process is complete lowers.

Figure 11B:
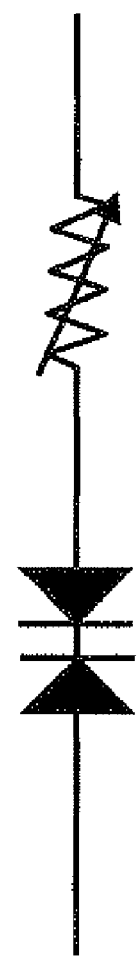

(3) Though in the above described second embodiment, the memory cell array 501b shown in the equivalent circuit diagram in FIG. 11A has a number of memory cells with two terminals where one terminal of a nonvolatile variable resistive element and one terminal of a selection diode are connected are aligned in a matrix in the exemplary structure, the invention is not necessarily limited to this, and as shown in the equivalent circuit diagram in FIG. 11B, barristers may be formed by connecting two diodes in series in the opposite direction, and memory cells with two terminals may be formed by connecting one terminal of a nonvolatile variable resistive element and one terminal of the barrister, and thus, a memory cell array may be formed by aligning these memory cells in a matrix. In this case, the first selection line decoder applies a first selection voltage to the selected first selection line, so that a voltage of a breakdown voltage of the diode or higher is applied only to the barristers that are connected to the selected first selection line, and thus, a current flows only through the nonvolatile variable resistive elements of the memory cells that are connected to the selected first selection line.

(4) Though in the above described second embodiment, the forming detection circuit 510 is located between the memory cell array 501b and the second selection line decoder 508 so that the voltage pulse for a forming process can be applied through the second selection lines and the fluctuation in the potential of the second selection lines can be detected as the resistance of the nonvolatile variable resistive elements of the memory cells lowers as the forming completes in the exemplary structure, the forming detection circuit may be located between the memory cell array 501b and the first selection line decoder 506, so that a structure where a voltage pulse for a forming process can be applied through the first selection lines and the fluctuation in the potential of the first selection lines can be detected as the resistance of the nonvolatile variable resistive elements of the memory cells lowers as the forming completes is possible. That is to say, the device 2 of the present invention can be reconstructed by switching the first selection lines in the second embodiment to second selection lines and the second selection lines to first selection lines. In this case, the positions of the selection diode and the nonvolatile variable resistive element are simply switched in each memory cell in the equivalent circuit diagram in FIG. 10.

Figure 13:
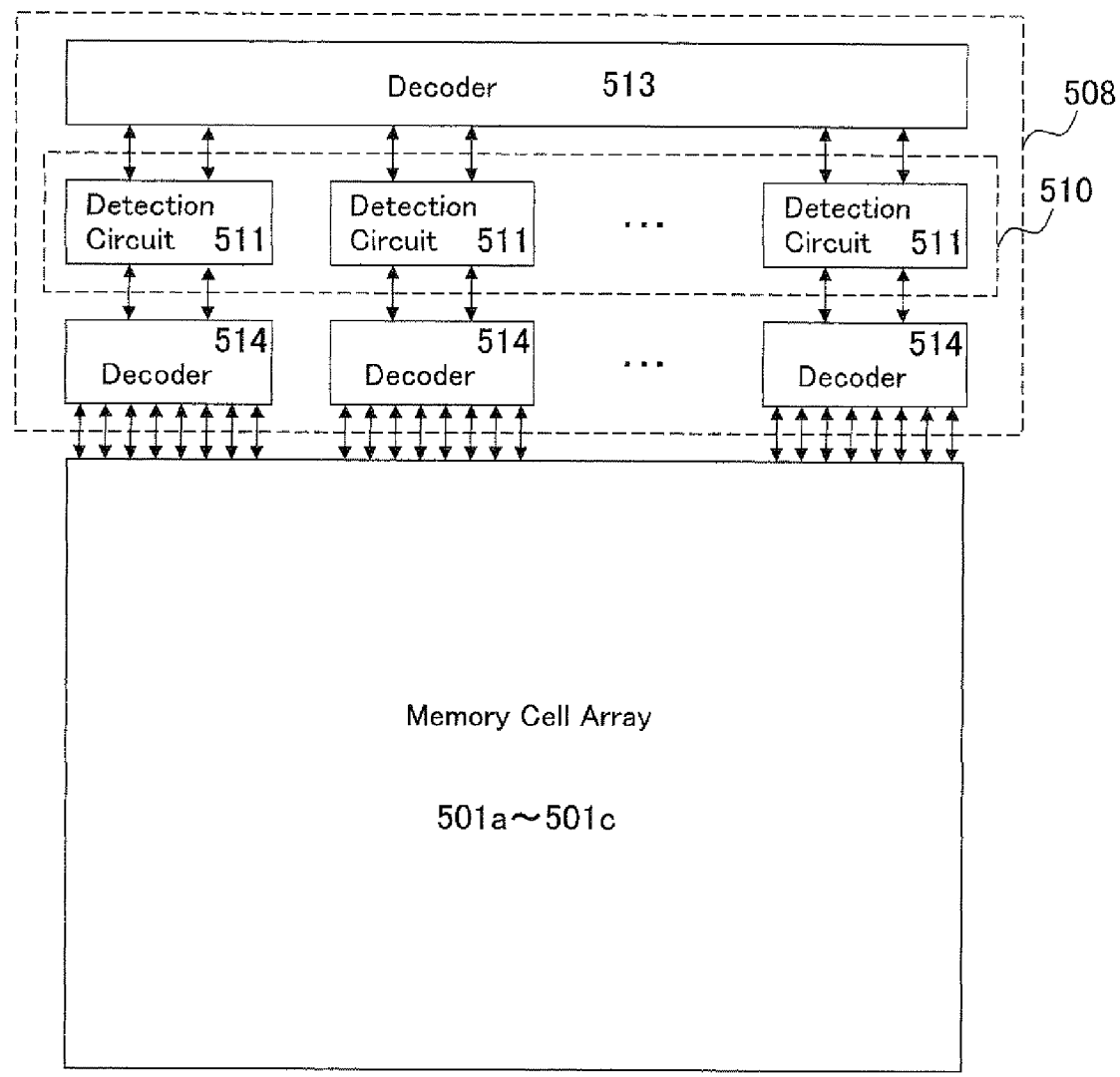
FIG. 13 is a block diagram showing the configuration of the second selection line decoder having a built-in forming detection circuit according to another embodiment of the present invention.

(5) Though the forming detection circuit 510 has an exemplary configuration where the circuit shown in FIG. 7 made of a circuit L and a p type MOS transistor is connected to each second selection line between the memory cell array and the second selection line decoder 508 in the above described first and second embodiments and it is connected to each third selection line between the memory cell array and the third selection line decoder 509 in the above described other embodiments, this circuit may be provided within the second selection line decoder 508 or the third selection line decoder 509, as shown in FIG. 13. FIG. 13 shows the forming detection circuit according to another embodiment, where a number of detection circuits 511 that are the same as the circuit shown in FIG. 7 formed of a circuit L and a p type MOS transistor are built into the second selection line decoder 508 and inserted between the decoder 513 in the front stage and the decoder 514 in the rear stage. The output of the detection circuit 511 is inputted into the decoder 514 in the rear stage, and the decoder 514 in the rear stage can select the second selection line to be connected to the memory cells for a forming process from among a number of second selection lines (for example eight lines) by means of a switching signal during the forming process for the memory cells.

The decoder 513 in the front stage selects the decoder 514 in the rear stage, to which the second selection line that is connected to the memory cells for a forming process is connected when an address input designates the memory cells for the forming process, and then applies a voltage pulse for a forming process to be applied to the selected second selection line to the decoder 514 in the rear stage through the detection circuit 511, and at the same time sends a switching signal to the decoder 514 in the rear stage. The decoder 514 in the rear stage selects one second selection line from among a number of second selection lines that are connected to the decoder 514 on the basis of the switching signal, and applies a voltage pulse for a forming process to the selected second selection line.

The detection circuit 511 disconnects the current path from the decoder 513 in the front stage to the decoder 514 in the rear stage when detecting fluctuation in the potential of the second selection line as a forming process is carried out on the selected memory cells during the forming process, and as a result temporarily stops the voltage pulse for the forming process that is applied to the decoder 514 in the rear stage. After that, the detection circuit 511 sends a switching signal to the decoder 514 in the rear stage to select the next second selection line that is connected to the decoder 514 in the rear stage and memory cells where the forming process is not yet complete, so that the application of the voltage pulse for a forming process is switched to the newly selected second selection line. This is repeated until the forming process is complete for all of the memory cells that are connected to the second selection lines that are connected to the decoder in the rear stage, so that the forming process can be efficiently carried out on all of the memory cells that are connected to the same first selection line.

Thus, even in cases where the memory cells are made smaller in size, and it is not realistic to provide forming detection circuits as those shown in FIG. 7 for all of the second selection lines, the structure allows the second selection line for forming detection to be selected from among a number of second selection lines via the decoder in the rear stage. As a result, a forming detection circuit can be connected every certain number of second selection lines, and therefore, the forming process for memory cells can be carried out efficiently while keeping the area occupied by the forming detection circuit small.

(6) Though the above described embodiments show a forming detection circuit that detects fluctuation in the potential of a second selection line as a concrete structure of the forming detection circuit 510 for detecting the completion of the forming process for the memory cells that are connected to the second selection lines, it may detect increase in the current that flows through a second selection line. In addition, though the embodiments show the circuit in FIG. 7, where a logic circuit L and a p type MOS transistor P are combined as a concrete example of the structure of the forming detection circuit 510, the present invention is not limited to this circuit structure.

(7) Though in the above described embodiments, the forming detection circuit 510 has such a structure as to function to disconnect the current path along the second or third selection line that is connected to the memory cells where the completion of forming is detected, and control the operation so that a voltage pulse for a forming process is not applied to the nonvolatile variable resistive elements of the memory cells where the forming process is completed, the present invention is not limited to this configuration. When fluctuation in the potential of the second or third selection line that is connected to the memory cells on which a forming process is to be carried out is detected, for example, the forming detection circuit 510 sends a forming completion signal to the second selection line decoder 508 directly or through the control circuit, and upon receiving this signal, the second selection line decoder 508 controls the operation so that the forming voltage stops being applied to the second selection line that is connected to the memory cells where the forming process is complete, and thus, the same effects can be gained.

The present invention is applicable to nonvolatile semiconductor memory devices, particularly for the control of a forming process on nonvolatile semiconductor memory devices having nonvolatile variable resistive elements.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising
    a memory cell array where memory cells are aligned in a matrix, each memory cell being formed by connecting one terminal of a nonvolatile variable resistive element with two terminals having electrodes at both ends of a variable resistor to one terminal of a selection element with two terminals for controlling a current flowing through the selection element through application of a voltage across the two terminals, or one of two terminals other than a control terminal of a selection element with three terminals for controlling a current flowing between the two terminals through application of a current or a voltage to the control terminal, wherein
    the memory cells are connected to each other within the memory cell array through first selection lines extending in a direction of rows for connecting the memory cells in a same row, and second selection lines extending in a direction of columns for connecting the memory cells in a same column,
    a forming process makes the nonvolatile variable resistive element transit between two or more different resistance states when electrical stress is applied across the two terminals of the nonvolatile variable resistive element, so that one resistance state after transition can be used for storing information,
    a forming detection circuit is provided to detect completion of the forming process on the nonvolatile variable resistive element for each of the memory cells to which a forming voltage for the forming process is to be applied when a plurality of nonvolatile variable resistive elements connected to a same first selection line on which the forming process is to be carried out are selected by applying a current or a voltage to corresponding selection elements through the first selection line, and the forming voltage is simultaneously applied to the selected nonvolatile variable resistive elements through different second selection lines, and
    the forming detection circuit is configured to prevent the forming voltage from being applied to the second selection lines connected to the nonvolatile variable resistive elements for which the completion of the forming process is detected.

2. The nonvolatile semiconductor memory device according to claim 1, wherein
    the selection element is a selection element with three terminals, and
    each of the memory cells is formed such that the control terminal of the selection element is connected to the first selection line, either one terminal of the nonvolatile variable resistive element having no connection to the selection element or one terminal other than the control terminal of the selection element having no connection to the nonvolatile variable resistive element is connected to the second selection line and other is connected to the third selection line, and
    the forming voltage is applied between the second selection line and the third selection line.

3. The nonvolatile semiconductor memory device according to claim 1, wherein
    the selection element is a selection element with two terminals,
    each of the memory cells is formed such that either one terminal of the nonvolatile variable resistive element having no connection to the selection element or one terminal of the selection element having no connection to the nonvolatile variable resistive element is connected to the first selection line and other is connected to the second selection line, and
    the forming voltage is applied between the first selection line and the second selection line.

4. The nonvolatile semiconductor memory device according to claim 1, wherein
    when detecting a fluctuation in a current flowing through a predetermined point along the second selection line or a potential at a predetermined point along the second selection line due to the completion of the forming process, the forming detection circuit stops application of the forming voltage through the second selection line for which fluctuation in the current or the potential is detected, and
    the forming detection circuit is connected to the second selection line to which the forming voltage is applied, directly or through a decoder for the second selection lines.

5. A control method for a forming process on a nonvolatile variable resistive element in a nonvolatile semiconductor memory device, the nonvolatile semiconductor memory device comprising
    a memory cell array where memory cells are aligned in a matrix, each memory cell being formed by connecting one terminal of a nonvolatile variable resistive element with two terminals having electrodes at both ends of a variable resistor to one terminal of a selection element with two terminals for controlling a current flowing through the selection element through application of a voltage across the two terminals, or one of two terminals other than a control terminal of a selection element with three terminals for controlling a current flowing between the two terminals through application of a current or a voltage to the control terminal, wherein
    the memory cells are connected to each other within the memory cell array through first selection lines extending in a direction of rows for connecting the memory cells in a same row, and second selection lines extending in a direction of columns for connecting the memory cells in a same column,
    a forming process makes the nonvolatile variable resistive element transit between two or more different resistance states when electrical stress is applied across the two terminals of the nonvolatile variable resistive element, so that one resistance state after transition can be used for storing information, the control method for the forming process comprises:
selecting one first selection line having a connection to the memory cells on which the forming process is to be carried out within the memory cell array;
selecting the second selection lines individually having connection to the memory cells on which the forming process is to be carried out within the memory cell array;
applying a forming voltage for the forming process simultaneously to the selected second selection lines;
detecting fluctuation in a current flowing through a predetermined point along the second selection line or a potential at a predetermined point along the second selection line due to completion of the forming process; and
preventing the forming voltage from being applied to the second selection line for which the fluctuation in the current or potential is detected, and
the forming process is carried out simultaneously on the nonvolatile variable resistive elements of the memory cells having connection to a same first selection line.

* * * * *